United States Patent [19]
Manabe et al.

[11] Patent Number: 5,345,178
[45] Date of Patent: Sep. 6, 1994

[54] METHOD FOR SETTING THE CURRENT THROUGH SHIM COILS AND GRADIENT COILS IN A NUCLEAR MAGNETIC RESONANCE APPARATUS

[75] Inventors: Atsutaka Manabe, Roettenbach, Fed. Rep. of Germany; Shigefumi Kakimoto, Kamagawa; Yasushiro Wada, Atsugi, both of Japan

[73] Assignees: Siemens Aktiengesellschaft; Siemens-Asahi Medical Technologies Ltd., both of Munich, Fed. Rep. of Germany

[21] Appl. No.: 47,307

[22] Filed: Apr. 19, 1993

[30] Foreign Application Priority Data

Apr. 21, 1992 [DE] Fed. Rep. of Germany ....... 4213050
Jun. 9, 1992 [DE] Fed. Rep. of Germany ....... 4218902

[51] Int. Cl.$^5$ ............................................. G01V 3/00
[52] U.S. Cl. ..................................... 324/320; 324/319
[58] Field of Search ............... 324/320, 319, 318, 322, 324/307, 309; 128/653.5

[56] References Cited

U.S. PATENT DOCUMENTS

| | | | |
|---|---|---|---|
| 4,672,318 | 6/1987 | Sekihara et al. | 324/320 |
| 4,680,551 | 7/1987 | O'Donnell et al. | 324/320 |
| 4,987,371 | 1/1991 | Glover et al. | 324/320 |
| 5,168,232 | 12/1992 | Glover et al. | 324/320 |

FOREIGN PATENT DOCUMENTS 0123200 10/1984 European Pat. Off. .
0184225 6/1986 European Pat. Off. .

OTHER PUBLICATIONS

"Aspects of Shimming a Superconductive Whole-Body MRI-Magnet," Frese et al., Proc. 9th Int. Conf. on Mag. Tech., Zurich, Sep. 9-13, 1985, pp. 249-251.
"Fast, Non-iterative Shimming of Spatially Localized Signals. In Vivo Analysis of the Magnetic Field along Axes," Gruetter, J. Mag. Res. vol. 96 (1992), pp. 323-334 (no month).
"The Ancient and Honourable Art of Shimming," Chmurny et al., Concepts in Magnetic Resonance, vol. 2 (1990) pp. 131-149 (no month).

*Primary Examiner*—Louis Arana
*Attorney, Agent, or Firm*—Hill, Steadman & Simpson

[57] ABSTRACT

For calculating the magnetic field inhomogeneity, a gradient echo sequence or a spin echo sequence having a non-central 180° radio-frequency pulse is first carried out. The nuclear magnetic resonance signal thus acquired is Fourier-transformed and the phase curve of the nuclear spins in a given region is identified. This is multiply repeated in different projections. The phase curves that are obtained are analyzed with a fit method and the coefficients of the spherical, harmonic functions describing the field distribution are identified therefrom. The current to be supplied to the individual shim coils and an offset current for the gradient coils can thus be calculated.

28 Claims, 12 Drawing Sheets

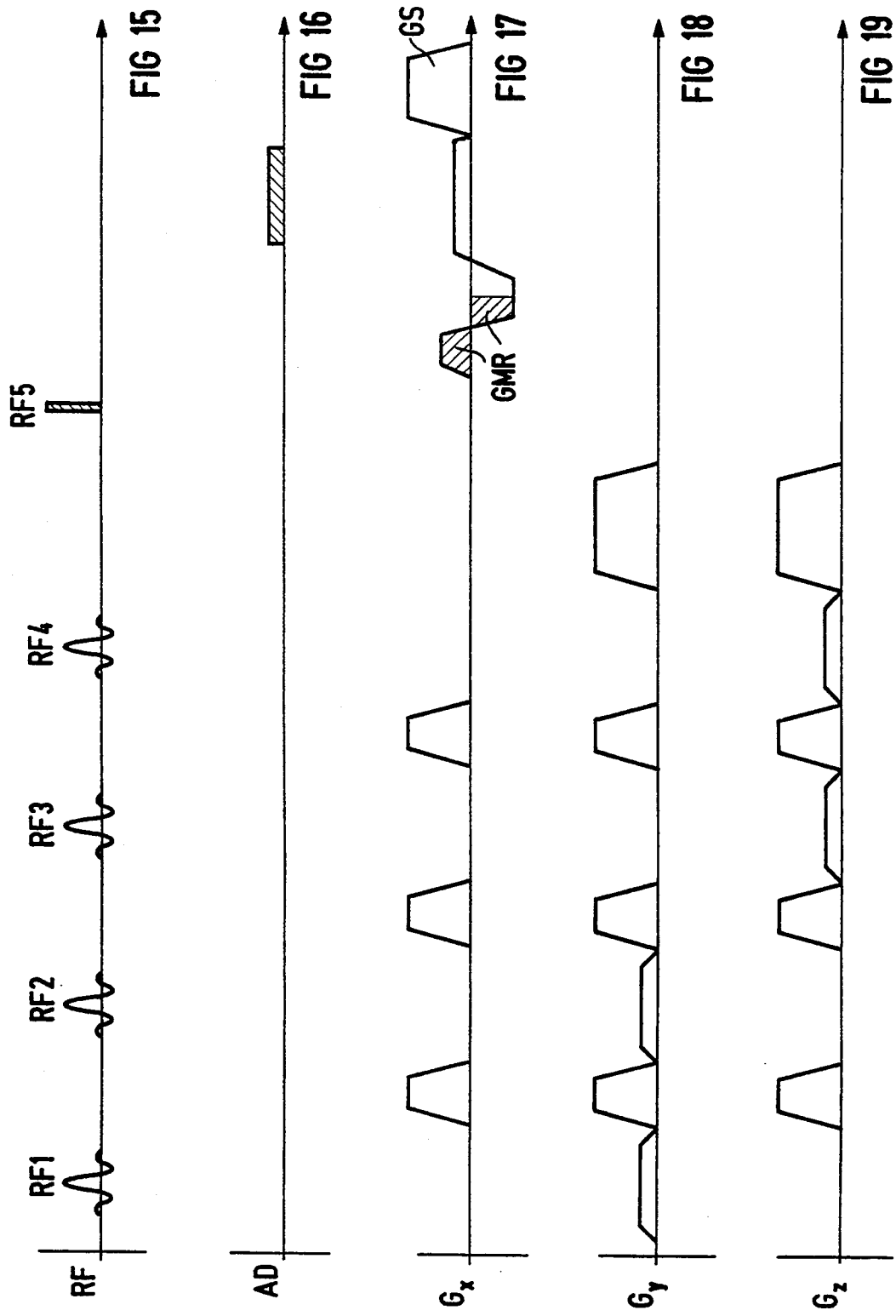

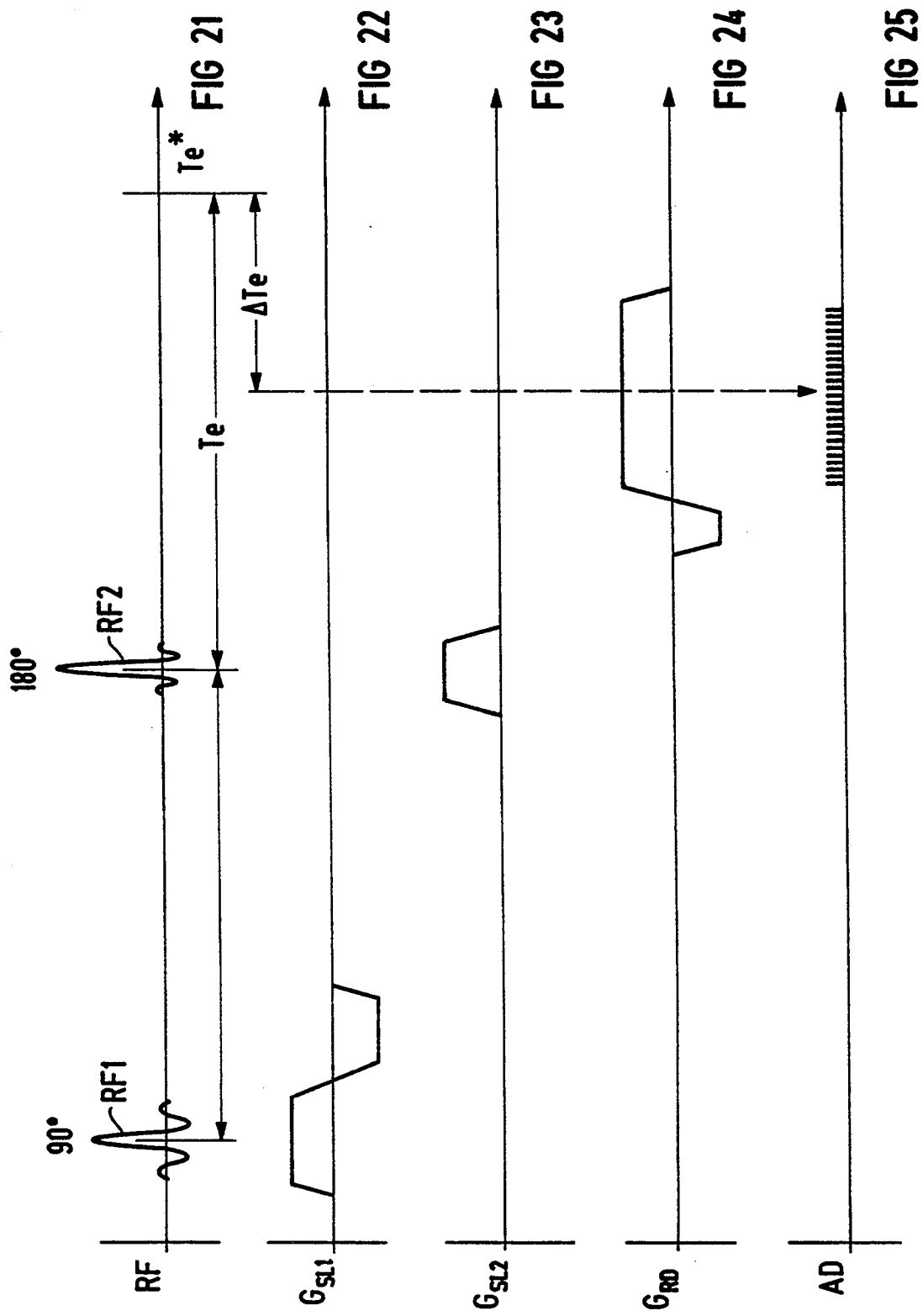

FIG. 26

|  | X-AXIS (Y=Z=0) | Y-AXIS (X=Z=0) | Z-AXIS (X=Y=0) | X=Y AXIS (Z=0) | X=-Y AXIS (Z=0) | X=Z AXIS (Y=0) | X=-Z AXIS (Y=0) | Y=Z AXIS (X=0) | Y=-Z AXIS (X=0) |
|---|---|---|---|---|---|---|---|---|---|
| A1,0 "Z" | 0 | 0 | $\alpha r$ | 0 | 0 | $\frac{\alpha}{\sqrt{2}} r$ | $-\frac{\alpha}{\sqrt{2}} r$ | $\frac{\alpha}{\sqrt{2}} r$ | $-\frac{\alpha}{\sqrt{2}} r$ |
| A2,0 "Z²" | $-\frac{\alpha}{2} r^2$ | $-\frac{\alpha}{2} r^2$ | $\alpha r^2$ | $-\frac{\alpha}{2} r^2$ | $-\frac{\alpha}{2} r^2$ | $\frac{\alpha}{4} r^2$ | $\frac{\alpha}{4} r^2$ | $\frac{\alpha}{4} r^2$ | $\frac{\alpha}{4} r^2$ |
| A3,0 "Z³" | 0 | 0 | $\alpha r^3$ | 0 | 0 | $-\frac{\sqrt{2}\alpha}{8} r^3$ | $\frac{\sqrt{2}\alpha}{8} r^3$ | $-\frac{\sqrt{2}\alpha}{8} r^3$ | $\frac{\sqrt{2}\alpha}{8} r^3$ |
| A4,0 "Z⁴" | $\frac{3\alpha}{8} r^4$ | $\frac{3\alpha}{8} r^4$ | $\alpha r^4$ | $\frac{3\alpha}{8} r^4$ | $\frac{3\alpha}{8} r^4$ | $-\frac{13\alpha}{32} r^4$ | $-\frac{13\alpha}{32} r^4$ | $-\frac{13\alpha}{32} r^4$ | $-\frac{13\alpha}{32} r^4$ |
| A1,1 "X" | $\alpha r$ | 0 | 0 | $\frac{\sqrt{2}\alpha}{2} r$ | $\frac{\sqrt{2}\alpha}{2} r$ | $\frac{\sqrt{2}\alpha}{2} r$ | $\frac{\sqrt{2}\alpha}{2} r$ | 0 | 0 |
| B1,1 "Y" | 0 | $\alpha r$ | 0 | $\frac{\sqrt{2}\alpha}{2} r$ | $-\frac{\sqrt{2}\alpha}{2} r$ | 0 | 0 | $\frac{\sqrt{2}\alpha}{2} r$ | $\frac{\sqrt{2}\alpha}{2} r$ |
| A2,1 "ZX" | 0 | 0 | 0 | 0 | 0 | $\alpha r^2$ | $-\alpha r^2$ | 0 | 0 |
| B2,1 "ZY" | 0 | 0 | 0 | 0 | 0 | 0 | 0 | $\alpha r^2$ | $-\alpha r^2$ |
| A2,2 "X²-Y²" | $\alpha r^2$ | $-\alpha r^2$ | 0 | 0 | 0 | $\frac{\alpha}{2} r^2$ | $\frac{\alpha}{2} r^2$ | $-\frac{\alpha}{2} r^2$ | $-\frac{\alpha}{2} r^2$ |
| B2,2 "XY" | 0 | 0 | 0 | $\alpha r^2$ | $-\alpha r^2$ | 0 | 0 | 0 | 0 |
| A3,1 "Z²X" | $-\frac{\alpha}{4} r^3$ | 0 | 0 | $-\frac{\sqrt{2}\alpha}{8} r^3$ | $-\frac{\sqrt{2}\alpha}{8} r^3$ | $\frac{\sqrt{2}\alpha}{16} r^3$ | $\frac{\sqrt{2}\alpha}{16} r^3$ | 0 | 0 |
| B3,1 "Z²Y" | 0 | $-\frac{\alpha}{4} r^3$ | 0 | $-\frac{\sqrt{2}\alpha}{8} r^3$ | $\frac{\sqrt{2}\alpha}{8} r^3$ | 0 | 0 | $\frac{3\sqrt{2}\alpha}{16} r^3$ | $\frac{3\sqrt{2}\alpha}{16} r^3$ |

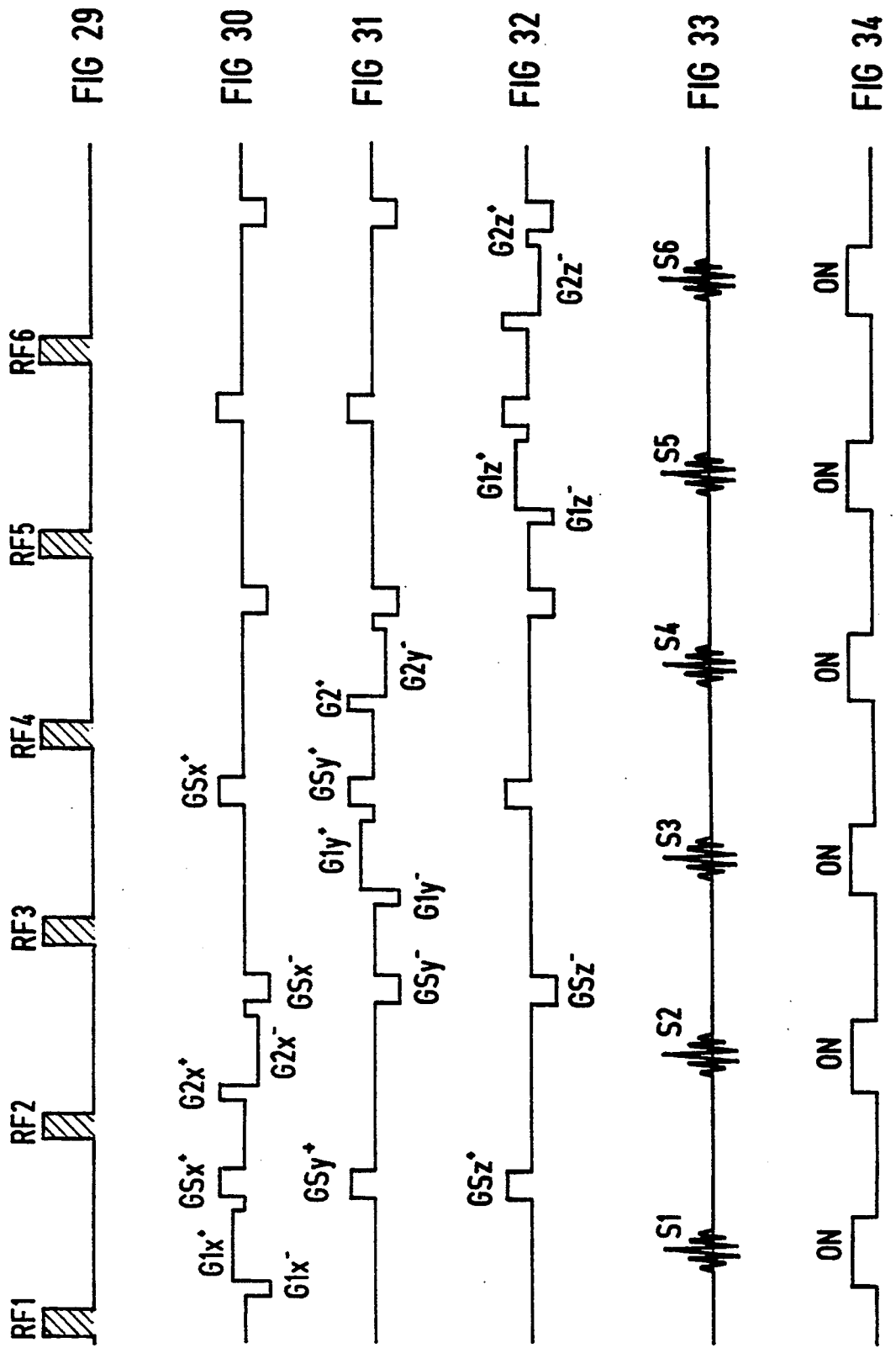

METHOD FOR SETTING THE CURRENT THROUGH SHIM COILS AND GRADIENT COILS IN A NUCLEAR MAGNETIC RESONANCE APPARATUS

BACKGROUND OF THE INVENTION

1. Field of the Invention

The invention is directed to a method for setting the current through shim coils and gradient coils in nuclear magnetic resonance apparatus.

2. Description of the Prior Art

The homogeneity of the basic magnetic field is a critical factor for the imaging quality in nuclear magnetic resonance imaging apparatus. Field inhomogeneities in the imaging cause geometrical imaging distortions in the image area that are proportional to the field deviations. The field homogeneity is particularly important in the echo-planar method.

Extremely high demands are also made on the field homogeneity in nuclear magnetic resonance devices used for spectroscopy in order to achieve an adequate resolution of the spectral lines. Field inhomogeneities lead to overlapping of spectral lines.

As described in the article "Aspects of Shimming a Superconductive Whole Body MRI Magnet," G. Frese et al, Proceedings of the 9th Int. Conf. on Mag. Techn. Zurich, 9–13 September, 1985, pp. 249–251, a magnetic field can be represented with the expansion coefficients of spherical, harmonic functions. It is likewise known from this article that field deviations can be compensated by electrical shim coils. Linear field deviations, i.e., field errors of the first order, can also be compensated by charging gradient coils with an offset current, i.e., a constant current that is superimposed on a gradient pulse sequence.

Given higher demands on the field homogeneity, not only linear field deviations, but also field errors of higher orders must be compensated. For this purpose, specific shim coils that are to be charged with a suitable current are provided in addition to the gradient coils. In the imaging, the shimming, i.e., the setting of the currents via the individual shim coils as well as, if necessary, the setting of the offset current of gradient coils, is advantageously implemented before the examination of every individual patient, and typically before every measurement in spectroscopy.

The setting of the currents for the shim coils and of the offset currents for the gradient coils in order to achieve an optimum field homogeneity represents a complex problem that has hitherto often been iteratively solved. Iterative methods, however, are comparatively time-consuming, so that the dwell time of patients in the nuclear magnetic resonance tomography apparatus is lengthened. This is disadvantageous both in view of the psychological stress on the patient (particularly those given a tendency to claustrophobia) as well as in view of the possible patient throughput.

A non-iterative method for general shimming of magnets is described in the article, "Fast, Non-Iterative Shimming of Spatially Localized Signals," in Journal of Magnetic Resonance, pp. 323–334 (1992). The phase of nuclear spins is thereby identified in the direction of a plurality of projections with stimulated echo sequences. The magnetic field course in these projections can be measured on the basis of the phase curve. Thus, the coefficients of the phase curve can be identified given presentation of the magnetic field in spherical, harmonic functions. Every shim coil is allocated to a spherical, harmonic function of the $n^{th}$ degree and $m^{th}$ order. The coefficients calculated according to the above-described method are then employed as a measure for the currents to be supplied to the shim coils.

SUMMARY OF THE INVENTION

It is an object of the present invention to implement a method for shimming a magnetic field such that an optimally high homogeneity is achieved in a short time.

The above object is achieved in accordance with the principles of the present invention in a method for shimming a magnetic field in an examination space of a nuclear magnetic resonance apparatus, wherein the magnetic field can be mathematically represented in the form of spherical, harmonic functions. The method provides steps for selecting a current to be provided to shim coils (if present) or for identifying a current to be supplied to the gradient coils, superimposed on the current supplied to the gradient coils for normal imaging purposes. In either case, the current supplied to the shim coils or superimposed on the gradient coil current is selected in accordance with the method so that the shim coils or the gradient coils produce a field distribution in the examination space which corresponds to a specific coefficient of the spherical, harmonic functions.

In accordance with the method, a nuclear magnetic resonance signal is obtained, such as by using a gradient echo sequence or a spin echo sequence, and the resulting nuclear magnetic resonance signal is Fourier-transformed. In obtaining the nuclear magnetic resonance signal by either of the above sequences, a gradient pulse in a given direction will have been employed. From the Fourier-transformed signal, the phase curve of the nuclear spins in this given direction is identified. These steps are then repeated for different directions of the gradient, each repetition of these steps producing a different phase curve. The phase curves are then analyzed with a curve fit method. The analysis of the phase curves with the curve fit method produces a polynomial having coefficients of the $i^{th}$ order, from which the coefficients of the spherical, harmonic functions of the $i^{th}$ order describing the field distribution are calculated. These coefficients are indicative of the degree of departure from ideal homogeneity of the field distribution, and a current can then be calculated, to be supplied to the shim coils or to be superimposed on the gradient coils, in order to compensate for this inhomogeneity.

In a further embodiment of the invention, the repeated steps can be implemented in immediate succession for a plurality of gradient directions by activating a spoiler gradient before each radio-frequency pulse in the sequence used to generate the nuclear magnetic resonance signals.

In a further embodiment, a pre-saturation sequence can be implemented which causes spins outside of a block of selected size, having edges extending in the direction of the respective gradient pulses, are saturated for each pulse sequence. This permits selected volumes within the total examination volume to be examined individually so that a more precise correction can be obtained, rather than examining and compensating within the entire examination volume at once. Alternatively, the radio-frequency pulse is used in the sequences to obtain the nuclear magnetic resonance signals can be frequency-selective and directed into the examination volume in the presence of a slice selection gradient, so that only one slice of the examination volume is excited at a time.

When a plurality of examinations are to be made using the nuclear magnetic resonance apparatus, the method can be implemented before each examination phase.

DESCRIPTION OF THE DRAWINGS

FIGS. 15 through 19 show a pulse sequence which can be used in combination with the pulse sequences of FIGS. 14a through 14f, in accordance with the principles of the present invention, to analyze only a volume block of selected size within the total examination volume.

FIGS. 21 through 25 show a pulse sequence which can be used in combination with the pulse sequences of FIGS. 14a through 14f, in accordance with the principles of the present invention, for examining a selected slice within the examination volume.

FIG. 26 is a table showing the twelve spherical coefficients related to the identified coordinate axes, obtained in accordance with the method of the invention.

FIGS. 29 through 34 show a pulse sequence for implementing the techniques of FIGS. 27 and 28 in the three directions of a Cartesian coordinate system.

DESCRIPTION OF THE PREFERRED EMBODIMENTS

As is known, a topical resolution of the nuclear magnetic resonance signals in nuclear magnetic resonance tomography ensues by superimposing a linear magnetic field gradient on a homogenous, static basic field on the order of magnitude of 1 tesla. The basic principles of such imaging are explained, for example, in the article by Bottomley, "NMR-Imaging Techniques and Application: A Review," in Review of Scientific Instrum., 53 (9), 9/82, pp. 1319–1337.

Figure 1:
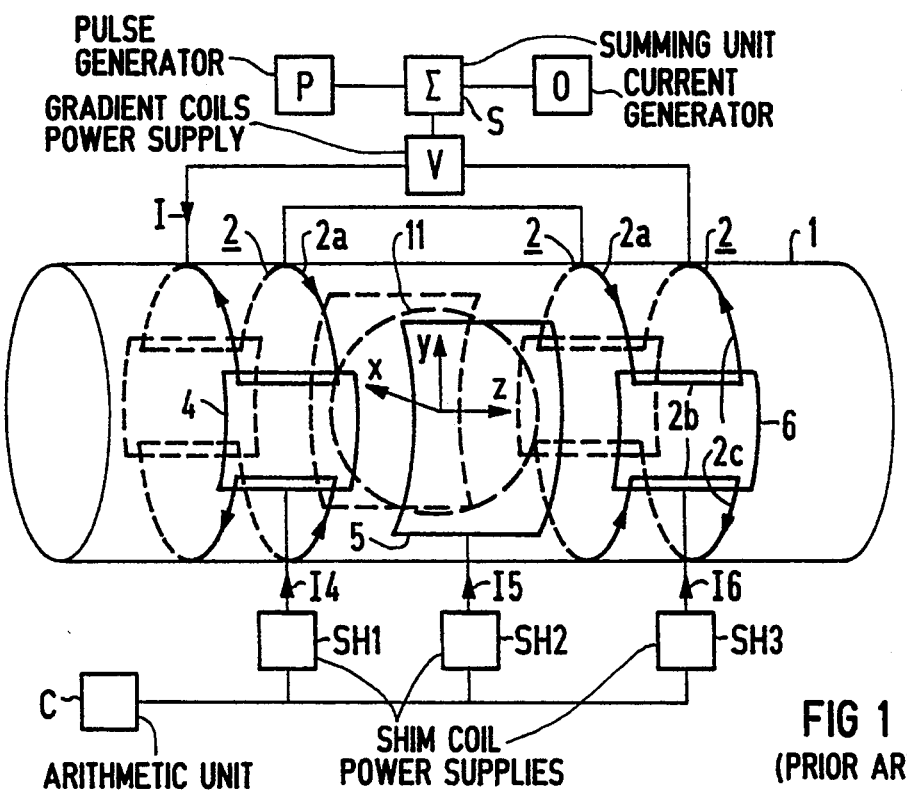
FIG. 1 is a schematic diagram showing an exemplary embodiment of an x-gradient coil (or a y-gradient coil) as well as saddle-shaped shim coils in a conventional (known) arrangement in a nuclear magnetic resonance apparatus, the apparatus being operable in accordance with the principles of the present invention.

For topical resolution in three dimensions, magnetic field gradients must be generated in three directions that preferably reside perpendicularly relative to one another. A set of Cartesian coordinate axes (x, y, z) that is intended to represent the direction of the respective gradients is shown in each of FIGS. 1 and 2. FIG. 1 schematically shows a conventional arrangement of gradient coils for generating a magnetic field gradient $G_y$ in the y-direction. The gradient coils 2 are executed as saddle coils that are secured on a carrying tube 1. A substantially constant magnetic field gradient $G_y$ in the y-direction is generated within a spherical examination volume 11 by the conductor section 2a. Due to their greater distance from the examination volume 11, the return conductors generate only negligible components therein.

The gradient coils for the x-magnetic field gradients are identical to the gradient coils 2 for the y-magnetic field gradients and are merely turned by 90° in the azimuthal direction on the carrying tube 1. For the sake of clarity, they are therefore not shown in FIG. 1.

Shim coils 4 through 6 that are likewise executed as saddle coils are also shown in FIG. 1. The shim coils 4 through 6 are merely schematically indicated; details about the design of shim coils may be found, for example, in U.S. Pat. No. 3,569,823. Every shim coil 4 through 6 has a respective power supply SH1 through SH3 allocated to it, these supplying the respective shim coils 4 through 6 with currents 14 through 16. The currents 14 through 16 can be controlled via an arithmetic unit C.

Figure 2:
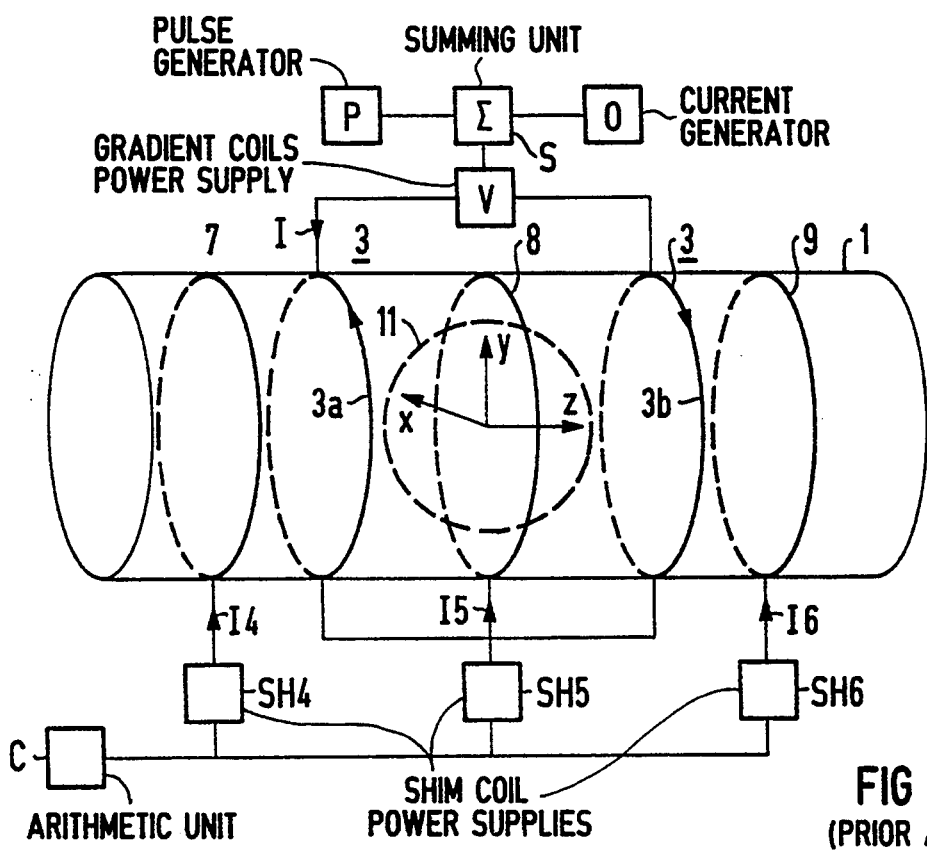
FIG. 2 is a schematic diagram showing an exemplary embodiment of a z-gradient coil, as well as further shim coils, for use in a nuclear magnetic resonance apparatus in combination with the coil arrangement of FIG. 1.

The gradient coils 3 for the magnetic field gradients in the z-direction are schematically shown in FIG. 2. The coils are annularly executed and are symmetrically arranged relative to the mid-point of the examination volume 11. Since the two individual coils 3a and 3b are permeated by current in opposite directions as shown in FIG. 2, they generate a magnetic field gradient in the z-direction. Further shim coils 7 through 9, which are annular in this case and which are likewise charged with currents 14 through 16 via current supplies SH4 through SH6, are also shown in FIG. 2, again only schematically. The currents 14 through 16 can again be controlled by the arithmetic unit C.

Details regarding the design of gradient coils may be found in EP-81-0073402.

The power supply V for the gradient coils 2 and 3 is also schematically shown in FIGS. 1 and 2. The current I through the respective gradient coil 2 or 3 is defined by a pulse generator P, prescribing a measurement sequence and by a generator O for a current. The output signals of the pulse generator P and of the generator O are added in a summing unit S.

As set forth in the aforementioned article by Frese et al., "Aspects of Shimming a Superconductive Whole Body MRI Magnet," magnetic fields can be represented on the basis of spherical, harmonic functions. The solution for the axial component Bz of the magnetic field is:

$$Bz(r) = \sum_{n=0}^{\infty} (r|R)^n \sum_{m=0}^{\infty} P(n,m)(\cos\theta) [A(n,m)\cos(m\phi) + B(n,m)\sin(m\phi)],$$

wherein r, $\Theta$ and $\phi$ are the spherical coordinates of the vector e,rar/r/ , r is the radius of the volume to be imaged, P(n,m) are the corresponding Legendre polynomials of the degree n and of the order m, and A(n,m) and B(n,m) are the coefficients of the spherical, harmonic functions. The coefficient A(0,0) characterizes the homogenous basic field; all other coefficients describe homogeneity deviations. As set forth in U.S. Pat. No. 3,569,823, cited above, shim coils can be fashioned such that they essentially influence one of these coefficients, i.e., compensate the field disturbance corresponding to these coefficients.

In practice, of course, only a limited number of shim coils can be provided, so that only a corresponding number of the said coefficients of the spherical, harmonic functions can be set to zero. In nuclear magnetic resonance tomography and in spectroscopy, one generally manages with 9 non-linear shim coils even given high demands, so that—together with the three gradient coils,—12 spherical coefficients that have the greatest disturbing effect on the field distribution can be brought to zero.

It is first necessary for shimming to identify the existing field course.

The inventive method for this purpose shall be set forth below with reference to FIGS. 3 through 10.

Figure 3:
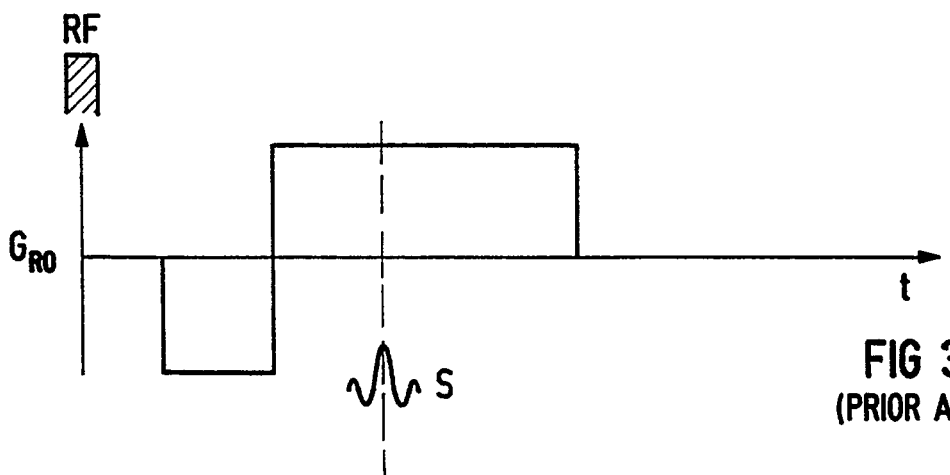
FIG. 3 shows a conventional gradient echo sequence in ideal form.

FIG. 3 schematically shows a conventional gradient echo sequence wherein, following a radio-frequency excitation pulse RF, the excited spins are first dephased by a gradient $G_{RO}$ and are then in turn rephased by reversing the polarity of the gradient $G_{RO}$. A gradient echo signal S appears at time $t_0$ in a magnetic field that is completely homogenous apart from the gradient $G_{RO}$, wherein the time $t_0$ is defined as the time required for the time integral to become zero over the entire, effective gradient $G_{RO}$:

$$\int_o^{t_o} G_{RO}(t)dt = 0$$

Figure 4:
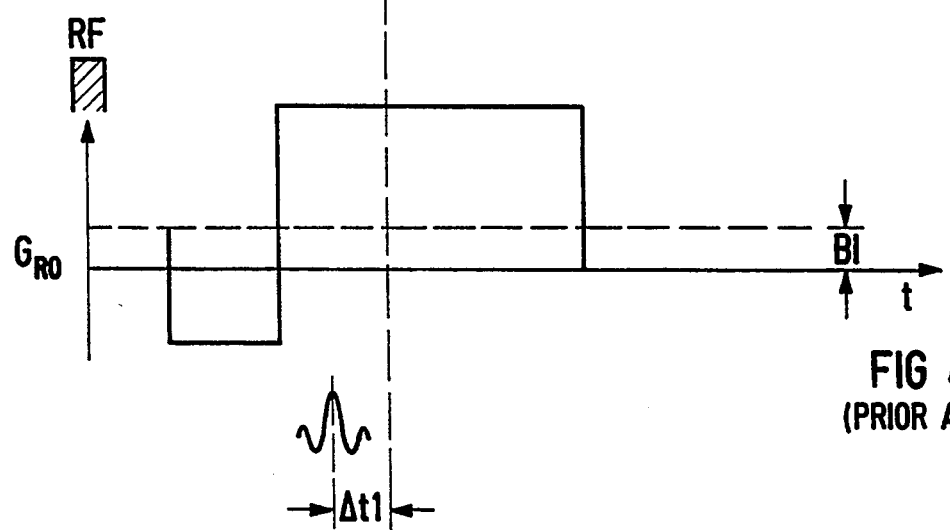
FIG. 4 shows a conventional gradient echo sequence in the presence of a positive, linear inhomogeneity in the basic magnetic field.

FIG. 4 shows the same pulse sequence, whereby a field inhomogeneity BI—assumed to be linear in this case—in the direction of the gradient $G_{RO}$ is superimposed upon the basic magnetic field. This linear field inhomogeneity BI in the direction of the gradient $G_{RO}$ can be added to the latter and leads to the fact that the echo condition is now reached earlier, i.e., the signal S precedes the normal echo time $t_0$ by the time span $\Delta t1$.

Figure 5:
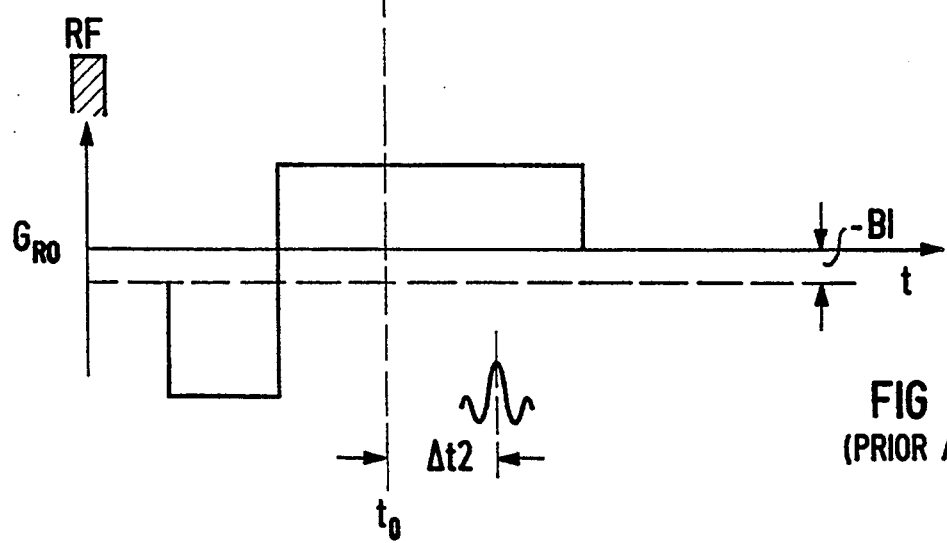
FIG. 5 shows a conventional gradient echo sequence in the presence of a negative, linear inhomogeneity in the basic magnetic field.

FIG. 5 shows the gradient echo sequence of FIG. 3, whereby a negative, linear field deviation is present in the direction of the gradient $G_{RO}$. This leads to the fact that the echo time now lies following the normal echo time $t_0$ by the time span $\Delta t2$.

The time shift $\Delta t$ thus represents the measure for linear field deviations in the direction of the gradient $G_{RO}$.

Figure 6:
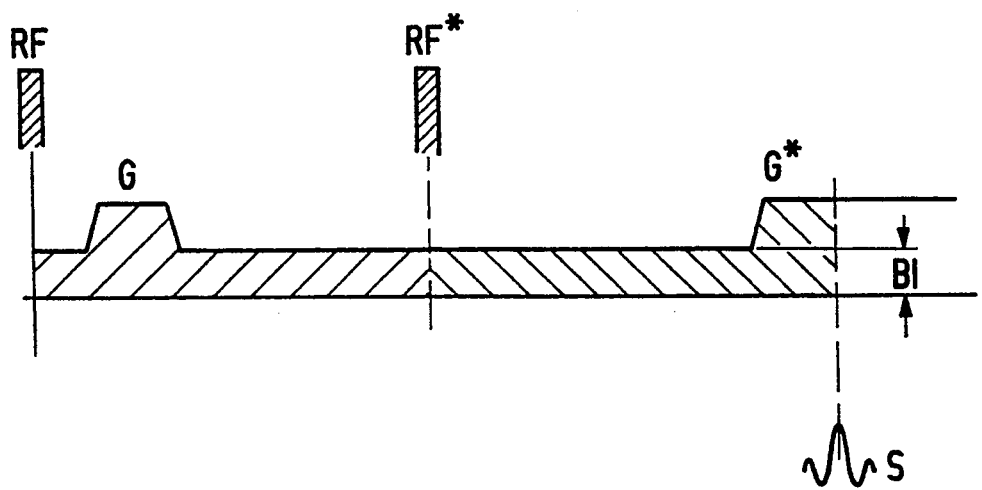
FIG. 6 shows a conventional spin echo sequence in ideal form.

Information about field inhomogeneity can be obtained not only with gradient echoes, but also with spin echoes in an alternative embodiment according to FIGS. 6 though 8. For explanation, a conventional spin echo sequence is first shown in FIG. 6. A radio-frequency pulse RF is thereby first followed by a gradient G, then by a 180° radio-frequency pulse RF*, and finally by a gradient G* under which a spin echo S is read out. A linear field inhomogeneity B1, i.e., a field inhomogeneity of the first order, is effective in the direction of the gradient G during the entire time. This corresponds to an additional gradient in the direction of the gradient G.

In the normal case, the 180° radio-frequency pulse RF* is centrally arranged between the radio-frequency pulse RF and the spin echo signal S. This leads to the fact that a constant field inhomogeneity BI does not influence the position of the spin echo signal S, since the gradient areas to the left and right of the 180° radio-frequency pulse RF* are the same.

Figure 7:
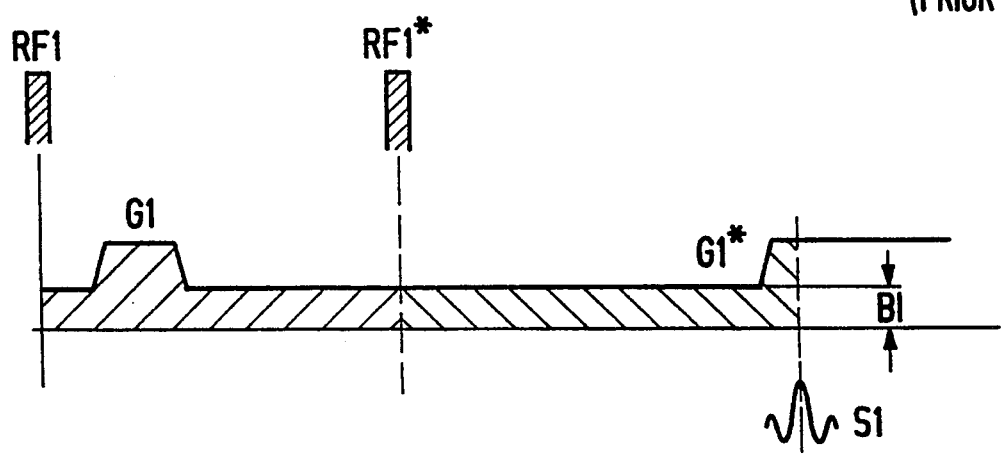
FIG. 7 shows a conventional spin echo sequence in the presence of a positive, linear inhomogeneity in the basic magnetic field.

In order to calculate the field inhomogeneity BI, the 180° radio-frequency pulse RF1* is shifted toward the left compared to the central position in a first sequence according to FIG. 7. Without field inhomogeneity, this would have no influence on the position of the spin echo S1, since only the gradient areas of the gradients G1 and G1* would be determinative for the echo condition. The linear field inhomogeneity BI, however, leads to the echo signal S1 being shifted toward the left (i.e., appears earlier). This becomes apparent on the basis of a comparison of the entire gradient area between first radio-frequency pulse RF1 and 180° radio-frequency pulse RF1* and the gradient area between 180° radio-frequency pulse RF1* and the echo signal S1.

In a second sequence having a second radio-frequency pulse RF2 and a second gradient pulse G2, the 180° radio-frequency pulse RF2* is shifted toward the right compared to the central position. The effect of the field inhomogeneity BI on the resulting spin echo signal S2 is a shift toward the right, this again becoming apparent on the basis of a comparison of the effective gradient areas.

Figure 8:
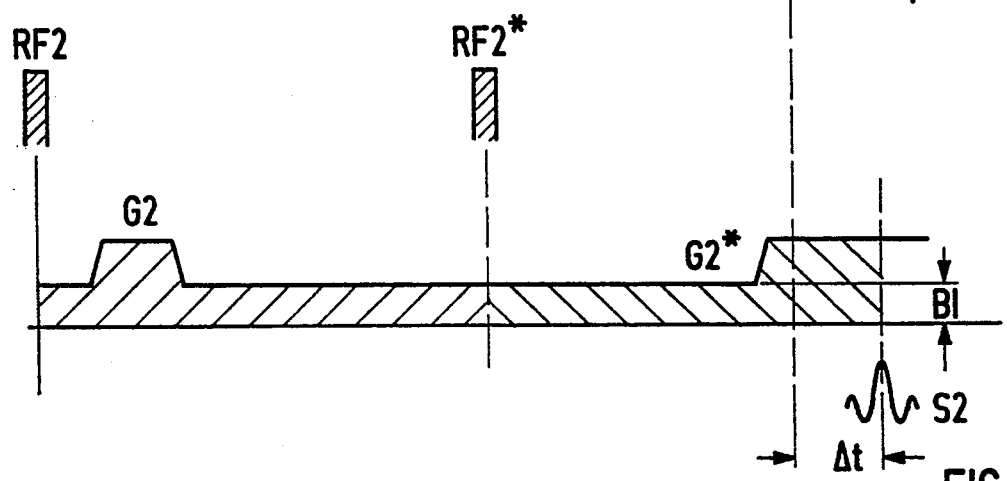
FIG. 8 shows a conventional spin echo sequence in the presence of a negative, linear inhomogeneity in the basic magnetic field.

By comparing the echo position in the two sequences of FIG. 7 and 8, one can thus likewise calculate a time difference $\Delta t$ that in turn represents a measure for the linear field inhomogeneity BI.

On the basis of a shift of echo times, thus, one could measure linear field inhomogeneities in a specific direction by gradient echo sequences or spin echo sequences having a gradient in this direction. The direct measurement of the time differences, however, has the disadvantage that only linear magnetic field deviations can be recognized thereby and the required identification of the echo centers is not entirely simple. Field inhomogeneities of a general type, however, can be calculated from the analysis of the phase curves acquired after Fourier transformation of the echo signals, as set forth below.

Figure 9:
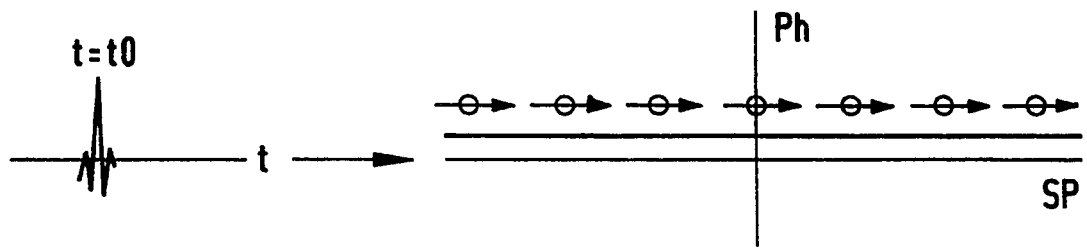
FIG. 9 is a schematic representation showing the phase relation to the spin position of a Fourier-transformed nuclear magnetic resonance signal, under ideal conditions.

Given a completely homogeneous magnetic field, all spins of a gradient echo have the same phase relation. When, thus, the echo signal is Fourier-transformed and evaluated with respect to phase, one obtains a constant value of the phase relation over the spin position. The echo position and the phase curve for the case of a completely homogenous field are shown in FIG. 9: the gradient echo appears exactly at the normal echo position $t_0$; the phase Ph schematically entered over the spin position SP has a constant value independently of the spin position SP.

Figure 10:
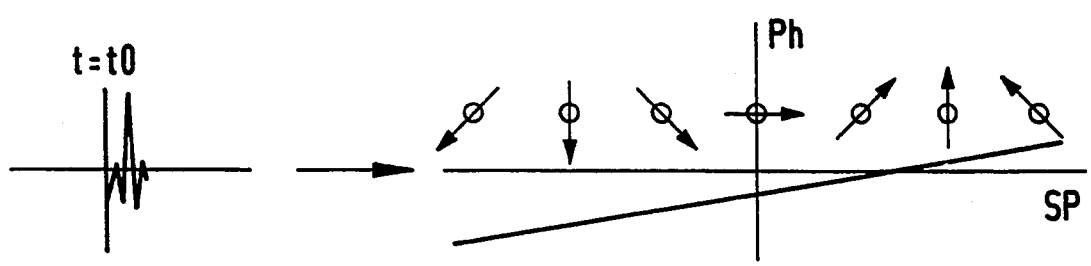
FIG. 10 is a schematic representation showing the phase curve in the presence of a negative, linear inhomogeneity in the basic magnetic field.
Figure 11:
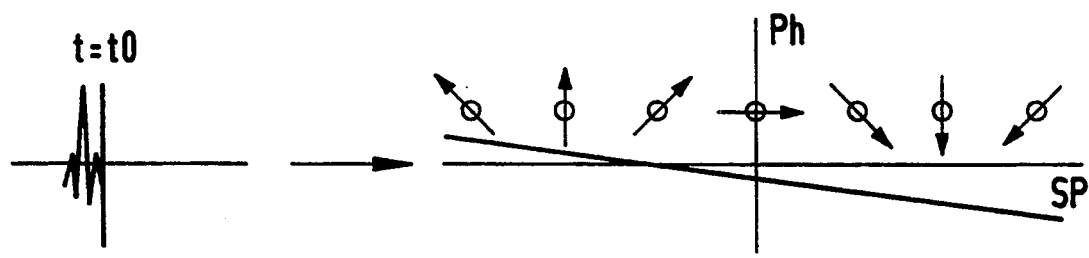
FIG. 11 is a schematic representation showing the phase curve in the presence of a positive, linear inhomogeneity in the basic magnetic field.

Corresponding to FIG. 5, FIG. 10 shows a negative linear field deviation, namely a field deviation of the first order in the direction of the gradient $G_{RO}$. In this case, the echo time is shifted toward the right, and the phase curve exhibits a slope that exactly corresponds to the echo time shift and represents the information about the field inhomogeneity of the first order in the direction of the gradient $G_{RO}$. The analogous case is shown in FIG. 11 for a positive linear field deviation (i.e., again for field inhomogeneity of the first order).

Figure 12:
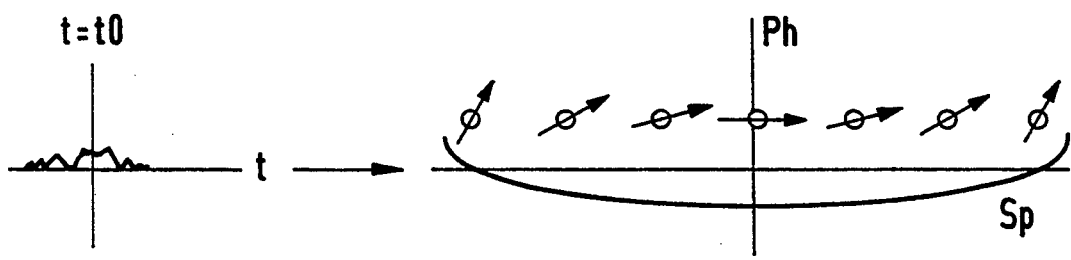
FIG. 12 is a schematic representation of the phase curve in the presence of a basic magnetic field exhibiting inhomogeneities of the second order (i.e., non-linear).

Not only field deviations of the first order, but also field deviations of a higher order can be acquired with the assistance of the Fourier transformation. At the left, FIG. 12 shows a signal in the time domain, whereby the magnetic field does not exhibit any field inhomogeneity of the first order, but exhibits field inhomogeneities of the second order. Therefore, although the echo time is not shifted, the echo is spread. The allocated phase curve having the schematically illustrated phase relations of individual spins characterizes field inhomogeneities of the second order.

Figure 13:
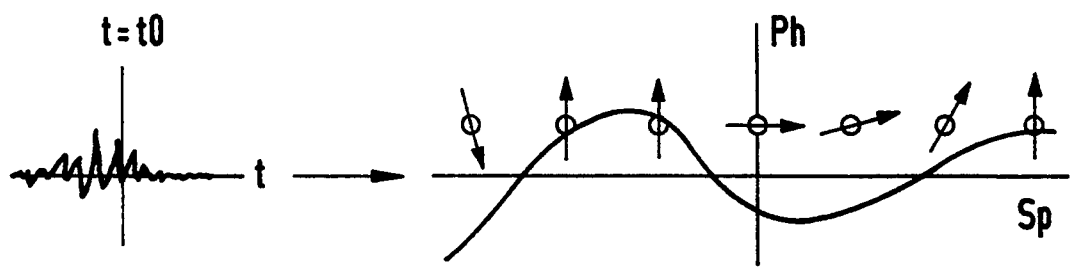
FIG. 13 is schematic representation of the phase curve in the presence of a basic magnetic field having field inhomogeneities higher than the second order.
Figure 14A:
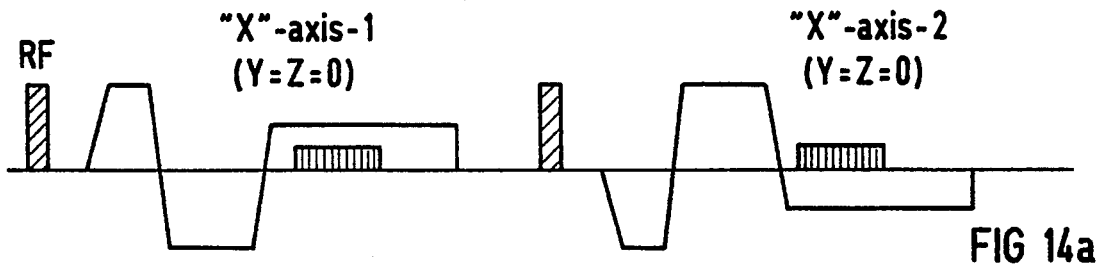
FIGS. 14a through 14F respectively show pulse sequences, in accordance with the inventive method, for calculating the twelve spherical coefficients in the table of FIG. 26.
Figure 14B:
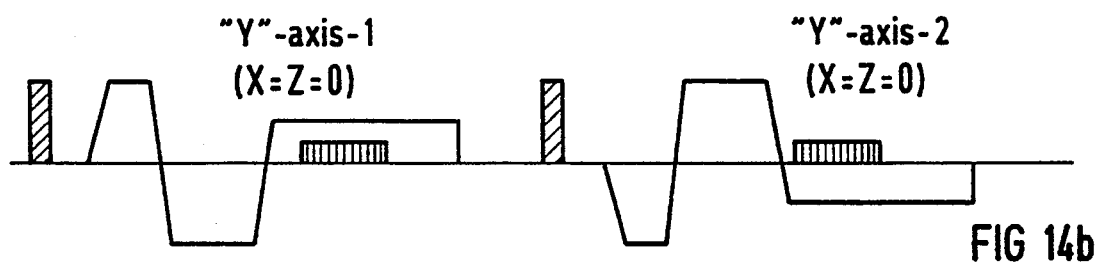
Figure 14C:
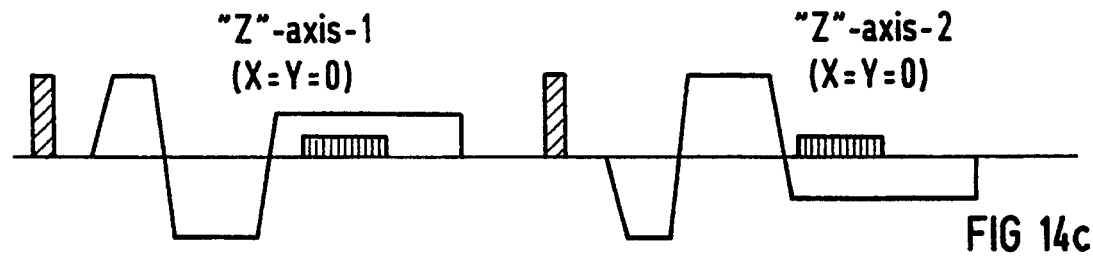
Figure 14D:
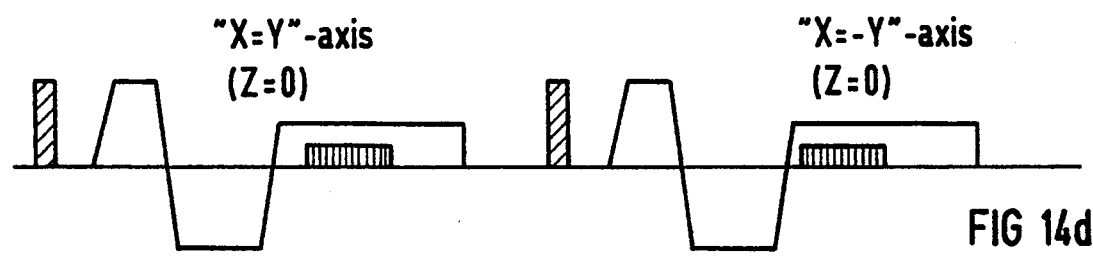
Figure 14E:
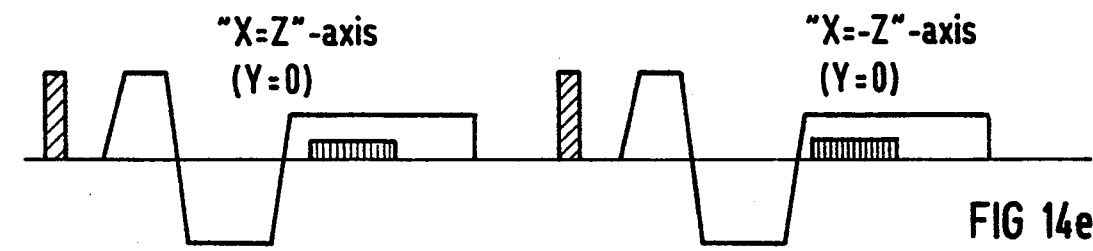
Figure 14F:
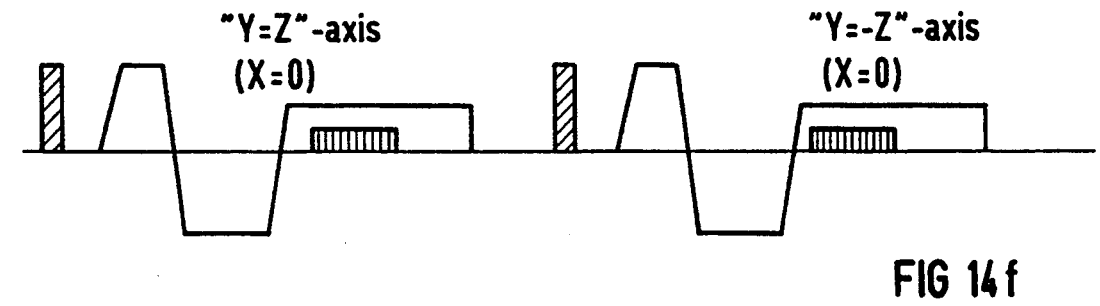

FIG. 13 is directed to field inhomogeneities of a higher order, wherein the time signal is no longer directly indicative at all with respect to the field inhomogeneity. The phase curve, however, also clearly represents the field inhomogeneity of the higher order.

Stated generally, thus, the field course in the direction of the applied gradient can be identified by generating a gradient echo or a spin echo, by Fourier transformation of the nuclear magnetic resonance signal thus obtained and evaluation of the phase information thus obtained. Field inhomogeneities of the $n^{th}$ order are expressed in a phase curve of the same order. In order to obtain adequate information about field inhomogeneities, such a method must be implemented for a plurality of gradient directions, referred to below as projections. The number of necessary projections depends on how many of the terms describing the field inhomogeneity are to be compensated in the representation of the magnetic field with spherical, harmonic functions. Each coefficient of the spherical, harmonic function to be eliminated must thus be identified by projections. In order to keep the plurality of required projections low, the projection axes are selected such that the effect on the individual coefficients can be separated as simply as possible. The table in FIG. 26 shows the twelve spherical coefficients A(n,m) and B(n,m) that usually contribute the greatest amount to field inhomogeneities. These coefficients refer to a representation of the basic magnetic field according to the equation for Bz($\vec{r}$) set forth above. The abbreviation for these components is also shown in the same column in Cartesian notation.

It has proven beneficial for calculating the coefficients according to Table 1 to identify the field course in the following projections: x-axis, y-axis, z-axis, axis x=y, axis x=−y, axis x=z, axis x=−z, axis y=z and axis y=−z. the table shows how field inhomogeneities that are described by the spherical coefficients A(n,m), B(n,m) influence these projections. The distance from the origin is thereby referenced r and α represents a coefficient. For example, one can recognize the following relationships:

Field inhomogeneities characterized by the coefficient A2.0 influence all projections.

Field inhomogeneities characterized by the coefficient A2.2 influence the x, y, x=z, x=−z, y=z, y=−z projections.

Field inhomogeneities characterized by the coefficient B2.2 appear in the projections x=y and x=−y, i.e., on axes that have an angle of 45° or 135° within the x/y plane.

All twelve spherical coefficients can be calculated on the basis of this table.

In practice, the phase curve obtained with the Fourier transformation is evaluated by smoothing and implementing a fit method using the smoothed curve, following the Fourier transformation. Polynomial coefficients are thereby attained that are placed in relationship to the polynomial coefficients of the equation 1 for Bz($\vec{r}$) cited above. All polynomial coefficients from the table can thus be calculated step-by-step to obtain the spherical coefficients. The precision of the method can be improved by implementing not only one measurement per projection, but by averaging a plurality of measurements. In practice, more than nine measurements according to the table are made, since offset effects must be eliminated. This can be illustrated with reference to FIGS. 4 and 5. In order to calculate the time shift $-\Delta t1$ free of offsets, the same sequence can be undertaken with an inverse operational sign of the gradient $G_{RO}$. The negative time shift $-\Delta t1$ (FIG. 4) thus becomes a positive time shift can then be calculated offset-free from the difference between the two times. This correspondingly applies to the Fourier transformation method and to terms of a higher order.

FIGS. 14a through 14f respectively show the pulse sequences that are preferably employed for calculating the twelve spherical coefficients of the table. The sampling interval for the nuclear magnetic resonance signal is referenced ADC. The x−, y− and z-projections are respectively implemented twice with different operational signs of the gradient. The remaining projections (x=y, x=−y, x=z, x=−z, y=z and y=−z) are each implemented only once. The second measurements for the x-, y- and z-projections respectively yield reference quantities for the elimination of offset effects.

Figure 20:
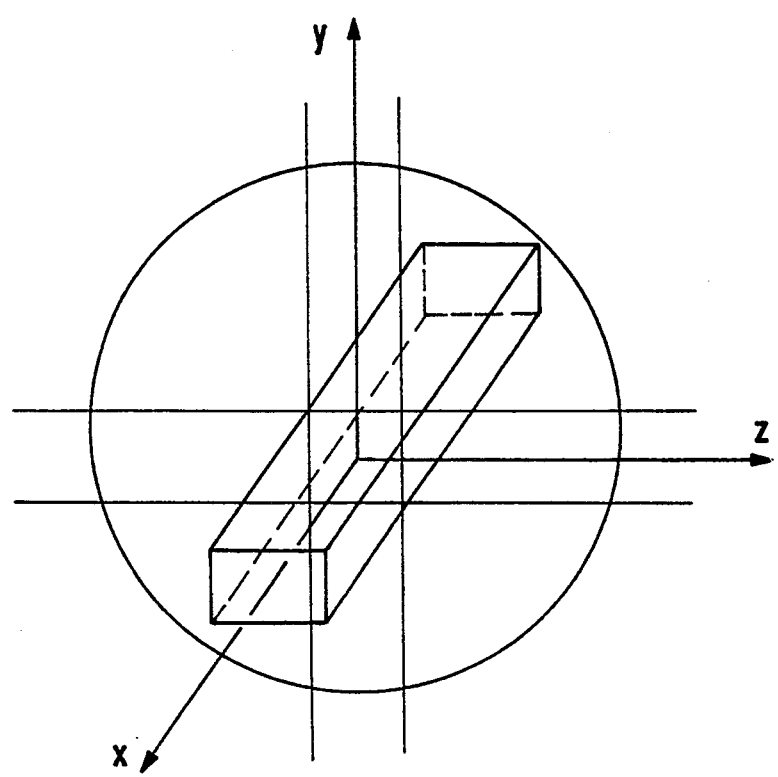
FIG. 20 is a schematic representation of the block of volume which can be examined in accordance with the pulse sequence of FIGS. 15-19.

It can also be advantageous not to refer the shim process to the entire examination volume, but to refer to a block for each projection direction, this block extending in the direction of the projection. This can be achieved by a pre-saturation with a pulse sequence as shown in FIGS. 15 through 19. A first frequency-selective radio-frequency pulse RF1 is thereby generated together with a gradient $G_y$, so that a slice lying perpendicular to the y-direction is excited. Three spoiler gradients Gx, Gy, Gz then follow, then another radio-frequency pulse RF2 that has a different frequency spectrum from the first radio-frequency pulse RF1 and that is likewise generated in under a gradient $G_y$. Finally, three spoiler gradients Gx, Gy, Gz again follow. All spins that lie outside a central slice lying perpendicular to the y-axis are saturated with the pulse sequence set forth to this point. Further, all spins that lie outside a central slice lying perpendicular to the z-axis are saturated with the further radio-frequency pulses RF3 and RF4, each of which is generated under the influence of a gradient Gz, and with the spoiler gradients Gx, Gy, Gz that follow every radio-frequency pulse RF3, RF4. Only the spins of a block extending in the x-direction thus remain unsaturated, this being shown in FIG. 20. After this presaturation, the spins that are still unsaturated are excited with a further radio-frequency pulse RF5 and a gradient echo signal S is read out as in the preceding examples. As set forth, this pulse sequence must be implemented for a plurality of directions.

Differing from the pulse sequences discussed above, the exemplary embodiment of a pulse sequence according to FIGS. 15 through 19 still contains a motion-refocusing gradient pulse in the x-direction that is referenced GMR (gradient motion refocusing). Motion artifacts can be avoided with this bipolar gradient. The effect of motion-refocusing pulses is disclosed, for example, in U.S. Pat. No. 4,616,180.

Further, another spoiler gradient GS in the x-direction is shown at the end of the sequence, this destroying the phase coherency that still exists, so that a further pulse sequence for another projection can be implemented immediately thereafter. The selection of an examination volume in block form, which was achieved by pre-saturation in the example set forth above, can also be achieved by selective excitation. A corresponding exemplary embodiment is set forth below with reference to FIGS. 21 through 25.

FIG. 21 shows a frequency-selective 90° radio-frequency pulse RF1 that is generated under the influence of a slice selection gradient $G_{SL1}$ according to FIG. 22. This results in only a slice residing perpendicular relative to the first slice selection gradient $G_{SL1}$ being excited. Subsequently, the dephasing caused with the positive subpulse is in turn canceled by inverting the first slice selection gradient $G_{SL1}$. The spin population is inverted with a following, frequency-selective 180° radio-frequency pulse RF2. The 180° radio-frequency pulse is generated under a second slice selection gradient $G_{SL2}$, whereby the second slice selection gradient $G_{SL2}$ is perpendicular to the first slice selection gradient $G_{SL1}$. Only those nuclear spins that lie in a slice perpendicular to the direction of the second slice selection gradient $G_{SL2}$ are thus selectively inverted with the 180° radio-frequency pulse RF2.

Finally, a read-out gradient $G_{RO}$ is activated in negative direction and is then inverted. The nuclear magnetic resonance signals are read out under the positive part of the read-out gradient $G_{RO}$, this being identified in FIG. 25 with individual sampling times AD.

All nuclear magnetic resonance signals are thus derived from a region that, first, must lie in the slice excited by the 90° radio-frequency pulse and that, further, lies in the slice inverted by the 180° radio-frequency pulse RF2. Non-inverted nuclear spins do not generate a spin echo and thus do not contribute to the nuclear magnetic resonance signal arising under the read-out gradient $G_{RO}$. A volume that corresponds to the intersection of the two selected slices is thus examined with the illustrated pulse sequence. This is in a block corresponding to FIG. 20, whereby the longitudinal direction of the block can be selected by the direction of the slice selection gradients $G_{SL1}$ and $G_{SL2}$. The thickness of the block is then determined by the frequency spectrum of the radio-frequency pulses RF1 and RF2.

As set forth above with reference to FIGS. 6 and 8, information about inhomogeneities in a spin echo sequence is only obtained when the 180° radio-frequency pulse RF2 does not lie centrally between the radio-frequency excitation pulse RF1 and the echo time $T_e$. In the pulse sequence according to FIGS. 21 through 25, the spacing of the actual echo time $T_e$ from an echo time $T_e^*$ which would lie centrally relative to the 180° radio-frequency pulse RF2 is referenced $\Delta T_e$.

If the correction is limited to the correction of linear magnetic field errors, it is adequate to charge gradients with an offset current. A method for calculating the suitable offset current as a simple special instance of the general method set forth up to now shall be set forth below with reference to FIGS. 27 and 28.

A 90° RF pulse RF is first directed into an examination volume. One of the gradient coils in the x-, y- or z-direction is charged with a current from a time $T_1$ to a time $T_2$, which generates a gradient G1− in the negative x-, y- or z-direction. The rise time of the gradient G1− is referenced $\Delta T$; the identical decay time is likewise referenced $\Delta T$ and its amplitude is referenced $-A_{de}$. Subsequently, the direction of the current through the gradient coil is reversed. The gradient in the positive x-, y- or z-direction thus arising is referenced G+, its amplitude is referenced $A_{rd}$ and its rise (or decay) time is referenced $\Delta T$.

As is known, the spins excited with the radio-frequency pulse RF1 are refocussed by the gradient inversion, so that a gradient echo signal S arises at time $T_e$. In a known way, the time of the echo is established by making the time interval of the positive gradient part G+ must be equal to the time integral of the negative gradient part G−. Expressed in other terms, the areas under both gradient parts G1− and G1+ must be identical.

Figure 27:
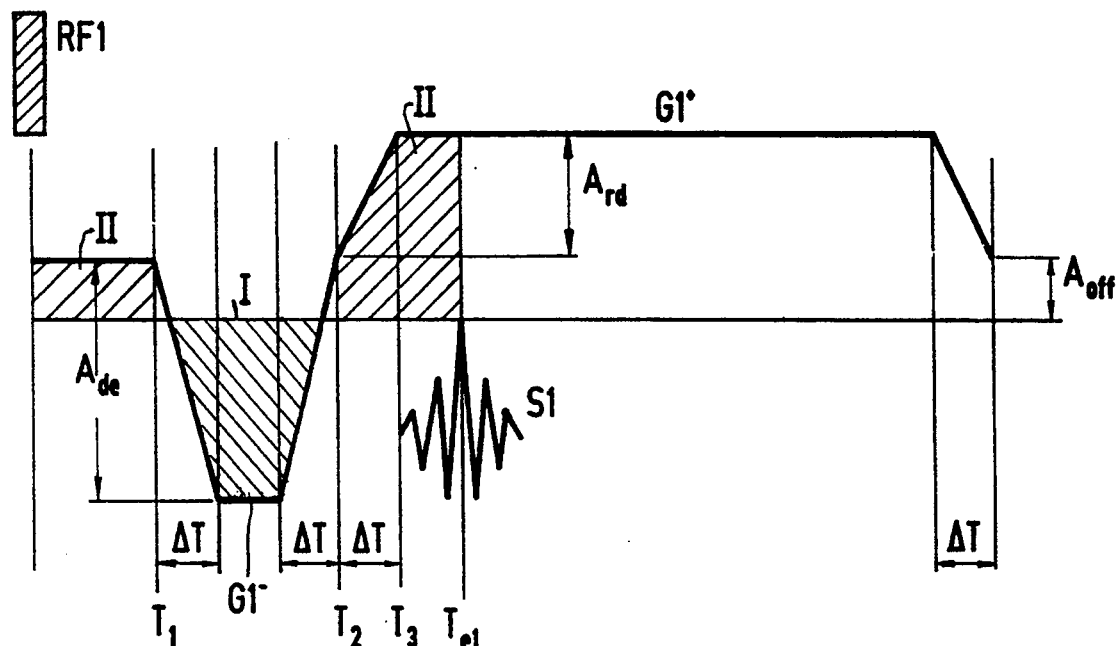
FIGS. 27 and 28 show an embodiment of the inventive method for the correction of exclusively linear magnetic field inhomogeneities.

If the basic magnetic field is not constant in the direction of the gradient G1, then the undesired magnetic field gradient thereby established is superimposed on the gradients as they are produced by the currents through the corresponding gradient coil. The gradient offset thus caused is positive in the exemplary embodiment of FIG. 27 and is referenced $A_{off}$. Given the echo condition (positive gradient area equals negative gradient area), the gradient offset $H_{off}$ caused by magnetic inhomogeneities must be taken into consideration and results in the example of FIG. 27 in a shift of the echo signal S1 toward the left. In FIG. 27, the negative effective area taking the gradient offset $A_{off}$ into consideration is shown dotted and the effective positive area is shown shaded. Both areas must be the same for the creation of the echo signal S.

Figure 28:
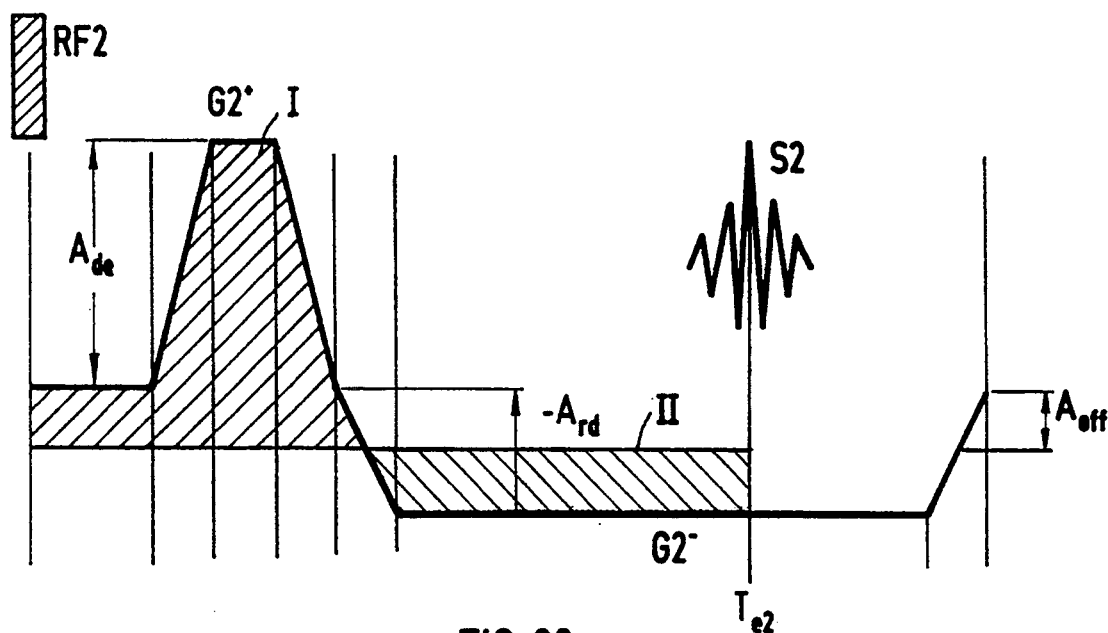

When, as shown in FIG. 28, the same sequence is undertaken with an inverted direction of the gradient G, then the echo signal is shifted toward the right on the time axis given the same gradient offset $A_{off}$. In this case, the echo condition is reached earlier, as can be easily recognized by comparison of the areas I and II.

Without gradient offset $A_{off}$, the echo signals given the sequences of FIGS. 27 and 28 would appear at the same time $T_e$ following the radio-frequency pulse RF. The existing gradient offset $A_{off}$ can be calculated according to the following method from the difference between the spacings of the respective echo signals S1 and S2 to the respective radio-frequency pulse RF1 or RF2 in the sequences of FIGS. 27 and 28. Proceeding from FIG. 27 and the echo condition that the time integral must be zero over the entire gradient G(t), the following equation derives:

$$\int_o^{t_e} G(t) = 0. \tag{1}$$

The entire gradient G(t) is thereby composed of the gradients G− and G+ and of the gradient offset $A_{off}$:

$$G(t) = G1^-(t) + G1^+(t) + A_{off}, \tag{2}$$

with $$\int_{T_2}^{T_2} G1^-(t)dt + \int_{T_2}^{T_e} G1^+(t)dt + A_{off}T_{e1} = 0. \tag{3}$$

The integrals are thus calculated as follows:

$$\int_{T_1}^{T_2} G1^-(t)dt = A_{de}(T_2 - T_1 - T) \tag{4}$$

and $$\int_{T_2}^{T_e} G_{rd}(t)dt = \frac{A_{rd}}{2}(T_3 - T_2) + A_{rd}(T_{e2} - T_3) \tag{5}$$

wherein $A_{de}$ is the amplitude of the gradient G− and $A_{rd}$ is the amplitude of the gradient G+.

Introducing equations (4) and (5) into (2) yields:

$$A_{de}(T_2 - T_1 - T) + \frac{A_{rd}}{2}(T_3 - T_2) - A_{rd}T_3 +$$

$$(A_{rd} + A_{off})T_{e1} = 0. \tag{6}$$

The echo time $T_{e1}$ is thus obtained as follows:

$$T_{e1} = \frac{-1}{A_{rd} + A_{off}} A_{de}(T_2 - T_1 - T) + \tag{7}$$

$$\frac{A_{rd}}{2}(T_3 - T_2) - A_{rd}T_3.$$

When the above equations are applied to the measurement sequence according to FIG. 28, then the corresponding echo time $T_{e2}$ derives as follows:

$$T_{e2} = \frac{-1}{A_{rd} - A_{off}} A_{de}(T_2 - T_1 - T) + \tag{8}$$

$$\frac{A_{rd}}{2}(T_3 - T_2) - A_{rd}T_3.$$

One obtains:

$$\frac{T_{e1}}{T_{e2}} = \frac{A_{rd} - A_{off}}{A_{rd} + A_{off}}. \tag{9}$$

From the equations (7) and (8) the gradient offset $A_{off}$ is:

$$A_{off} + \frac{T_{e2} - T_{e1}}{T_{e2} + T_{e1}} A_{rd}. \tag{10}$$

The time spans $T_{e1}$ and $T_{e2}$ can thereby be measured on the basis of the two sequences of FIG. 27 and FIG. 28; the gradient $A_{rd}$ is the fundamental quantity for the gradients deriving from the gradient coils and is thus known.

When the gradient offset has been calculated in this way, it can be compensated in a simple way by supplying the respective gradient coil with a corresponding offset current that is added to the gradient current delivered by the pulse generator. This offset current can thus be found with a simple method without time-consuming iterative methods.

As already stated for the general case of shimming, the time spans $T_{e1}$ and $T_{e2}$ can be calculated Fourier-transforming each echo signal and comparing the slopes of the phase curves thus obtained. This slope is a measure for the time spacing between the echo position and the time origin for the Fourier transformation. When echo position and time origin coincide, a constant phase curve arises; when they do not coincide, positive or negative slopes that are proportional to the time spacing arise. If the basic magnetic field has deviations of a higher order, the phase curves are not linear. It is therefore advantageous to apply a linear fit method to the phase curves.

When a gradient offset is present, the slopes of the phase curves of the two sequences are unequal; a deviation of the slopes is a measure for the gradient offset $A_{off}$. The gradient offset current that is necessary in order to compensate the gradient offset $A_{off}$ can again be calculated on the basis of this deviation.

In order to compensate error terms of the first order of the magnetic field in all three spatial directions, the described method generally will be implemented in three spatial directions, i.e., with respect to the three existing gradient coils. A corresponding sequence is shown in FIGS. 29 through 34 whereby signal acquisition times are indicated with "on" in FIG. 34. To that end, a sequence of a total of six radio-frequency pulses RF1 through RF6 is generated in the exemplary embodiment. In order to be able to implement the measurement as quickly as possible, one does not wait for the end of the relaxation time of the spins between two radio-frequency pulses RF2 through RF6. In order nonetheless to avoid the influence of one measurement on the following measurement, every radio-frequency pulse RF in every gradient direction is preceded by a spoiler gradient $GS_x$, $GS_y$ and $GS_z$ that destroys any phase coherency that is still present. These spoiler gradients advantageously have the same direction as the immediately preceding gradient, so that their effect is intensified.

The pulse sequence for the x-gradient described with reference to FIGS. 27 and 28 is first implemented with the radio-frequency pulses RF1 and RF2. As described, the signals S1 and S2 thereby obtained are applied for the offset compensation in x-direction. Corresponding respective sequences for the y-gradient and the z-gradient are implemented with the radio-frequency pulses RF3 and RF4, and RF5 and RF6. The signals S3 and S4, and S5 and S6, thereby respectively arising are again employed for the respective offset compensation of the y-gradient and the z-gradient. The described method for compensation of the gradient offset can be quickly implemented. If necessary, this balancing is possible before every examination with the nuclear magnetic resonance tomography apparatus without considerably lengthening the examination time, The required gradient offset, however, can also be calculated on the basis of spin echoes, as was already set forth above with reference to FIGS. 6 though 8.

By comparing the echo positions in the two sequences of FIGS. 7 and 8, one can thus calculate a time difference $\Delta t$ that in turn represents a measure for the gradient offset $A_{off}$. As set forth above, the time difference $\Delta t$ can be expediently calculated by Fourier transformation of the echo signals S1 and S2 and by comparison of the slopes of the phase curves thus obtained. The offset current low required for the compensation of the gradient offset $A_{off}$ can then be calculated from the time difference $\Delta t$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for shimming a basic magnetic field in an examination space of a nuclear magnetic resonance apparatus, said basic magnetic field being mathematically representable in the form of spherical, harmonic functions whereby shim coils are arranged in the nuclear magnetic resonance apparatus which are fashioned such that each shim coil essentially influences one coefficient of these functions, said method comprising the steps of:
    (a) generating a gradient echo sequence in said examination space including a radio-frequency pulse and a bipolar gradient pulse in a given direction to excite nuclear spins in said examination space and thereby obtaining a nuclear magnetic resonance signal;
    (b) Fourier-transforming said nuclear magnetic resonance signal to obtain a phase curve of the nuclear spins in said given direction;
    (c) repeating steps (a) and (b) with a bipolar gradient pulse in each repetition in a different direction to obtain a plurality of phase curves respectively associated with said different directions;
    (d) analyzing said phase curves with a curve fit method to obtain a polynomial having coefficients of the $i^{th}$ order;
    (e) calculating coefficients of said spherical, harmonic functions of the $i^{th}$ order describing the distribution of said basic magnetic field from said polynomial coefficients of the $i^{th}$ order, said coefficients of the spherical, harmonic functions of the $i^{th}$ order representing inhomogeneities in said basic magnetic field; and
    (f) supplying currents to a shim coil associated to the respective coefficients of said spherical, harmonic functions of the $i^{th}$ order for correcting said inhomogeneities.

2. A method as claimed in claim 1 wherein step (c) is further defined by repeating steps (a) and (b) in immediate succession with said different directions of said bipolar gradient pulse, and comprising the additional step of generating, in said gradient echo sequence, a spoiler gradient before each radio-frequency pulse.

3. A method as claimed in claim 1 comprising the additional step of:
    for each gradient pulse sequence, generating a saturation sequence for saturating said nuclear spins outside of a block of selected size in said examination space, said block extending in the direction of the gradient pulse in each sequence.

4. A method as claimed in claim 1 wherein step (a) is further defined by:
    (a) generating a gradient echo sequence in said examination space including a slice-selective radio-frequency pulse in the presence of slice selection gradient, and a bipolar gradient pulse in a given direction to excite nuclear spins in said examination space and thereby obtaining a nuclear magnetic resonance signal.

5. A method as claimed in claim 1 wherein said apparatus is employed for conducting a plurality of examinations, and comprising the additional step of:
    conducting steps (a) through (f) prior to each of said examinations.

6. A method as claimed in claim 1 wherein steps (d), (e) and (f) are conducted for exclusively compensating for linear inhomogeneities in said basic magnetic field.

7. A method for shimming a basic magnetic field in an examination space of a nuclear magnetic resonance apparatus, said basic magnetic field being mathematically representable in the form of spherical, harmonic functions whereby shim coils are arranged in the nuclear magnetic resonance apparatus which are fashioned such that each shim coil essentially influences one coefficient of these functions, said method comprising the steps of:
    (a) generating a spin echo sequence in said examination space including, in chronological sequence, a first radio-frequency pulse, a first gradient pulse in a given direction, a second radio-frequency pulse having a flip angle of 180° and a second gradient pulse in said given direction to excite nuclear spins in said examination volume for thereby generating a nuclear magnetic resonance signal which is read out under said second gradient pulse, said radio-frequency pulse being non-central relative to said first radio-frequency pulse and said nuclear magnetic resonance signal;
    (b) Fourier-transforming said nuclear magnetic resonance signal to obtain a phase curve of the nuclear spins in said given direction;
    (c) repeating steps (a) and (b) with a gradient pulses in each repetition in a different direction to obtain a plurality of phase curves respectively associated with said different directions;
    (d) analyzing said phase curves with a curve fit method to obtain a polynomial having coefficients of the $i^{th}$ order;
    (e) calculating coefficients of said spherical, harmonic functions of the $i^{th}$ order describing the distribution of said basic magnetic field from said polynomial coefficients of the $i^{th}$ order, said coefficients of the spherical, harmonic functions of the $i^{th}$ order representing inhomogeneities in said basic magnetic field; and
    (f) supplying currents to a shim coil associated to the respective coefficients of said spherical, harmonic functions of the $i^{th}$ order for correcting said inhomogeneities.

8. A method as claimed in claim 7 wherein step (c) is further defined by repeating steps (a) and (b) in immediate succession with said different directions of said bipolar gradient pulse, and comprising the additional step of generating, in said gradient echo sequence, a spoiler gradient before each radio-frequency pulse.

9. A method as claimed in claim 7 comprising the additional step of:
    for each gradient pulse sequence, generating a saturation sequence for saturating said nuclear spins outside of a block of selected size in said examination space, said block extending in the direction of the gradient pulse in each sequence.

10. A method as claimed in claim 7 wherein step (a) is further defined by:
    (a) generating a gradient echo sequence in said examination space including a slice-selective radio-frequency pulse in the presence of slice selection gradient, and a bipolar gradient pulse in a given direction to excite nuclear spins in said examination space and thereby obtaining a nuclear magnetic resonance signal.

11. A method as claimed in claim 7 wherein said apparatus is employed for conducting a plurality of examinations, and comprising the additional step of:
    conducting steps (a) through (f) prior to each of said examinations.

12. A method as claimed in claim 7 wherein steps (d), (e) and (f) are conducted for exclusively compensating for linear inhomogeneities in said basic magnetic field.

13. A method for balancing the offset of gradient currents supplied to gradient coils, which respectively generate gradient pulses, in a nuclear magnetic resonance tomography apparatus, said method comprising the steps of:
    (a) generating a first radio-frequency pulse in an examination space in the presence of a basic magnetic field for exciting nuclear spins in a volume in said examination space extending in a first direction;
    (b) obtaining a first gradient echo signal by generating a first gradient pulse in said first direction followed by inversion of said first gradient pulse;
    (c) generating a second radio-frequency pulse for exciting nuclear spins in said volume in said examination space extending in said first direction;
    (d) obtaining a second gradient echo signal by generating a second gradient pulse in said examination space in a direction opposite to said first direction followed by inversion of said second gradient pulse, said first radio-frequency pulse and said first gradient echo signal having a first time span therebetween which differs from a second time span between said second radio-frequency pulse and said second gradient echo signal due to inhomogeneities in said basic magnetic field;
    (e) calculating an offset current from the difference between said first and second time spans such that said difference becomes zero in the presence of said offset current being supplied to one of said gradient coils; and
    (f) supplying said offset current to one of said gradient coils in addition to a current for causing said gradient coil to produce its associated gradient pulse.

14. A method as claimed in claim 13 comprising the additional steps of:
    Fourier-transforming each of said first and second gradient echo signals to respectively obtain first and second phase curves of said nuclear spins, each of said first and second phase curves having an average slope; and
    in step (e), identifying said difference between said first and second time spans by comparing the respective average slopes of said first and second phase curves.

15. A method as claimed in claim 13 wherein no gradient pulses are generated in the presence of said first and second radio-frequency pulses.

16. A method as claimed in claim 13 wherein steps (a) through (d) are conducted in immediate succession for a plurality of different directions of said first and second gradient pulses, and wherein steps (a) and (c) are further defined by generating a spoiler gradient before each of said first and radio-frequency pulses.

17. A method as claimed in claim 13 comprising the additional step of:
    before step (a) generating a pre-saturation sequence for saturating nuclear spins outside of a block in said examination volume extending in said directions of said first and second gradient pulses.

18. A method as claimed in claim 13 wherein step (a) is further defined by:
    (a) generating a first slice-selective radio-frequency pulse in the presence of a slice selection gradient in an examination space in the presence of a basic magnetic field for exciting nuclear spins in a volume in said examination space extending in a first direction; and
    wherein step (c) is further defined by:
    generating a second slice-selective radio-frequency pulse in the presence of a slice selection gradient for exciting nuclear spins in said volume in said examination space extending in said first direction.

19. A method as claimed in claim 13 wherein said apparatus is used for conducting a plurality of examinations, and wherein steps (a) through (f) are conducted prior to each of said examinations.

20. A method as claimed in claim 13 wherein said offset current is selected and supplied to said gradient coils exclusively for compensating for linear inhomogeneities in said basic magnetic field.

21. A method for balancing the offset of gradient currents supplied to gradient coils, which respectively generate gradient pulses, in a nuclear magnetic resonance tomography apparatus, said method comprising the steps of:
    (a) generating a first radio-frequency pulse in an examination space in the presence of a basic magnetic field for exciting nuclear spins in a volume in said examination space extending in a first direction;
    (b) generating a first gradient pulse in said examination space in a first direction;
    (c) generating a first 180° radio-frequency pulse;
    (d) reading out a first echo signal, generated by nuclear spins excited by said first radio-frequency pulse and said first 180° radio-frequency pulse, under a first read-out gradient in said first direction, said first 180° pulse being disposed non-centrally relative to said first radio-frequency pulse and first echo signal;
    (e) generating a second radio-frequency pulse in said examination space for exciting nuclear spins in said volume;
    (f) generating a second gradient pulse in said first direction in said examination space;
    (g) generating a second 180° radio-frequency pulse in said examination space having a different spacing relative to said second radio-frequency pulse from a space in between said first 180° radio-frequency pulse and said first radio-frequency pulse;
    (h) reading out a second spin echo signal, generated by nuclear spins excited by said second radio-frequency pulse and said second 180° radio-frequency pulse, under a second read-out gradient in said first direction, said first radio-frequency pulse and said first spin echo signal having a first time span therebetween and said second radio-frequency pulse and said second spin echo signal having a second time span therebetween which is different from said first time span due to inhomogeneities in said basic magnetic field;

(i) selecting an offset current based on said difference between said first and second time spans for causing said difference to become zero when said offset current is supplied to a gradient coil; and (j) supplying said offset current to said gradient coils for compensating inhomogeneities in said basic magnetic field.

22. A method as claimed in claim 21 comprising the additional steps of:

Fourier-transforming each of said first and second gradient echo signals to respectively obtain first and second phase curves of said nuclear spins, each of said first and second phase curves having an average slope; and in step (e), identifying said difference between said first and second time spans by comparing the respective average slopes of said first and second phase curves.

23. A method as claimed in claim 21 wherein no gradient pulses are generated in the presence of said first and second radio-frequency pulses.

24. A method as claimed in claim 21 wherein steps (a) through (d) are conducted in immediate succession for a plurality of different directions of said first and second gradient pulses, and wherein steps (a) and (c) are further defined by generating a spoiler gradient before of each of said first and second radio-frequency pulses.

25. A method as claimed in claim 21 comprising the additional step of:

before step (a) generating a pre-saturation sequence for saturating nuclear spins outside of a block in said examination volume extending in said directions of said first and second gradient pulses.

26. A method as claimed in claim 21 wherein step (a) is further defined by:

(a) generating a first slice-selective radio-frequency pulse in the presence of a slice selection gradient, for exciting nuclear spins in a volume in an examination space in the presence of a basic magnetic field, said volume extending in a first direction; and wherein step (e) is further defined by:

(e) generating a second slice-selective radio-frequency pulse in the presence of a further slice selection gradient for exciting nuclear spins in said volume.

27. A method as claimed in claim 21 wherein said apparatus is used for conducting a plurality of examinations, and wherein steps (a) through (f) are conducted prior to each of said examinations.

28. A method as claimed in claim 21 wherein said offset current is selected and supplied to said gradient coils exclusively for compensating for linear inhomogeneities in said basic magnetic field.

* * * * *